United States Patent
Tsukuda

(10) Patent No.: US 7,277,276 B2
(45) Date of Patent: Oct. 2, 2007

(54) MOUNTING STRUCTURE OF DISPLAY PANEL

(75) Inventor: Masanori Tsukuda, Hyogo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/350,850

(22) Filed: Feb. 10, 2006

(65) Prior Publication Data

US 2006/0126276 A1 Jun. 15, 2006

Related U.S. Application Data

(63) Continuation of application No. PCT/JP03/10327, filed on Aug. 13, 2003.

(51) Int. Cl.
*G06F 1/16* (2006.01)
(52) U.S. Cl. .......................... 361/681; 349/58
(58) Field of Classification Search ................ 361/681; 349/58
See application file for complete search history.

(56) References Cited

U.S. PATENT DOCUMENTS

| | | | | |
|---|---|---|---|---|
| 5,237,399 | A * | 8/1993 | Inada et al. | 348/761 |
| 7,032,824 | B2 * | 4/2006 | Miyazawa et al. | 235/462.43 |
| 2005/0253035 | A1 * | 11/2005 | Dozier | 248/286.1 |

FOREIGN PATENT DOCUMENTS

| JP | 1-139111 | 9/1989 |
|---|---|---|
| JP | 11-219134 | 8/1999 |
| JP | 2000-330481 | 11/2000 |
| JP | 2001-27752 | 1/2001 |

* cited by examiner

*Primary Examiner*—Yean-Hsi Chang
(74) *Attorney, Agent, or Firm*—Kratz, Quintos & Hanson, LLP

(57) ABSTRACT

A mounting structure for attaching a display panel (200) to a cover (100) of a display, comprising: a plurality of attaching portions (210) provided at a circumference of the display panel (200), each of the attaching portions including a screw hole penetrating thicknesswise of the display panel (200) and also including a guide wall formed on the surface of the display panel (200) facing the cover (100), the guide wall (230) surrounding the screw hole and extending thicknesswise of the display panel (200); and a plurality of bosses (300) vertically formed at the cover (100) and extending thicknesswise of the display panel (200), corresponding to a respective one of the attaching portions (210) for receiving screws, each of the bosses (300) integrally formed with at least two guide members (330, 340) that elastically contact the guide wall (230) and elastically deformed in a direction across an axis of the boss (300); wherein when the guide members (330, 340) of each of the bosses (300) come into elastic contact with the guide wall (230) of each of the attaching portions (210), a screw inserted through the screw hole of the attaching portion (210) is inserted into the respective boss (300).

6 Claims, 5 Drawing Sheets

MOUNTING STRUCTURE OF DISPLAY PANEL

This application is a continuation of international application PCT/JP03/10327 filed Aug. 13, 2003.

TECHNICAL FIELD

The present invention relates to a mounting structure of display panel, and more precisely, relates to a mounting structure for positioning and attaching a display panel, such as a liquid crystal display panel, to a cover of a display.

BACKGROUND ART

For example, as disclosed in JP-A-2001-27752, in making a display with a liquid crystal display panel, the liquid crystal display panel is attached to a cover of the display. A mounting structure of the liquid crystal display panel, disclosed in the above patent document, includes a plurality of attaching portions each having a screw hole provided at a circumference of the liquid crystal display panel, and also includes bosses, provided at the cover of the display, corresponding to the attaching portions. A tapping screw is inserted into the screw hole of the attaching portion and screwed into the boss.

In the above mounting structure, the inner diameter of the screw hole of the attaching portion is larger than the outer diameter of the tapping screw, for adjusting the position of the liquid crystal display panel relative to the cover, or for adjusting the position tolerance of the boss relative to the cover or the position tolerance of the attaching portion relative to the liquid crystal display panel. Thus, the position of the liquid crystal display panel relative to the cover is not constant. As a result, the liquid crystal display panel may be fixed in a manner such that the liquid crystal display panel is offset from the cover in the lateral direction or in the longitudinal direction, or in a manner such that the liquid crystal display panel is inclined relative to the cover, within the range of the gap between the screw hole of the attaching portion and the tapping screw inserted through the screw hole.

Further, in the structure disclosed in the above patent document, the cover, to which the liquid crystal display panel is attached, is positioned at the back side of the display panel, and to the back side cover, a front cover having a display window is attached. Due to this structure, in addition to the above-described positioning error, a positioning error between the back side cover and the front cover is generated, whereby the effective display area of the liquid crystal display panel may not be properly positioned relative to the display window of the front cover.

DISCLOSURE OF THE INVENTION

An object of the present invention is to provide a mounting structure for attaching a display panel to a cover of a display, in a constant positional relationship.

A mounting structure for attaching a display panel to a cover of a display according to the present invention, comprising: a plurality of attaching portions provided at a circumference of the display panel, each of the attaching portions including a screw hole penetrating thicknesswise of the display panel and also including a guide wall formed on the surface of the display panel facing the cover, the guide wall surrounding the screw hole and extending thicknesswise of the display panel; and a plurality of bosses vertically formed at the cover and extending thicknesswise of the display panel, corresponding to a respective one of the attaching portions for receiving screws, each of the bosses integrally formed with at least two guide members that elastically contact the guide wall and elastically deformed in a direction across an axis of the boss; wherein when the guide members of each of the bosses come into elastic contact with the guide wall of each of the attaching portions, a screw inserted through the screw hole of the attaching portion is inserted into the respective boss.

Preferably, the display panel is rectangular in front view, and the attaching portions are formed at a plurality of portions along side ends of the display panel, wherein the guide wall of each of the attaching portions includes a first wall and a second wall inwardly extending from the side end of the display panel and facing to each other, and also includes a third wall extending in parallel to the side ends of the display panel.

Preferably, one of the two guide members elastically contacts the first wall of the guide wall, while other one of the guide members elastically contacts the second wall of the guide wall, and at least one of the guide members also elastically contacts the third wall of the guide wall.

Preferably, the guide wall is provided by forming a recess, on the surface of the display panel facing the cover, open at the side end of the display panel.

Preferably, a tip end of each of the guide members is formed with a tapered portion.

Preferably, the cover is a front cover having an opening serving as a display window.

Other features and advantages will be apparent from the following description of the embodiment with reference to the accompanying drawings.

BEST MODE FOR CARRYING OUT THE INVENTION

Figure 1:
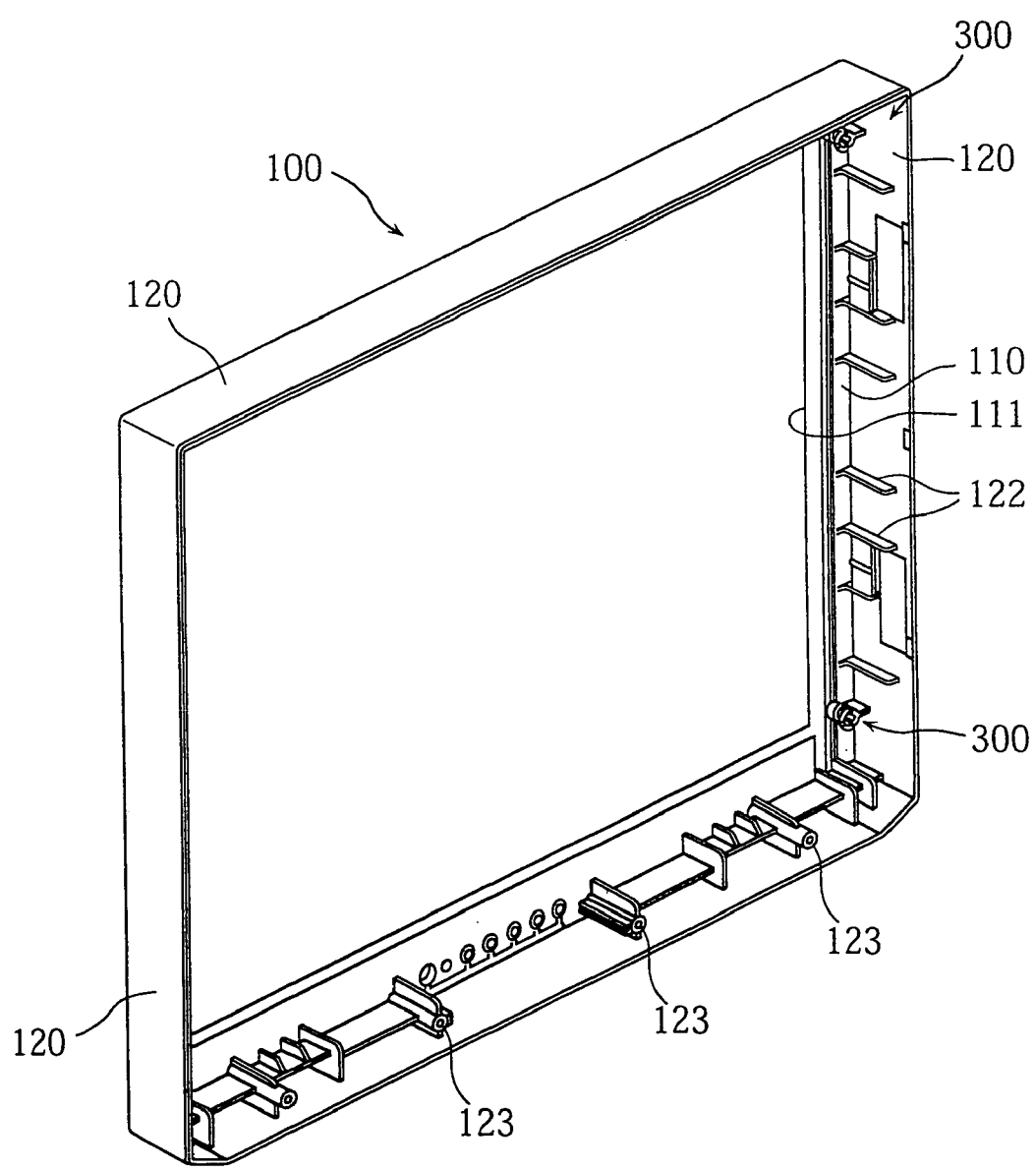
FIG. 1 is a perspective view illustrating a back side of a front cover according to an embodiment of the present invention.
Figure 2:
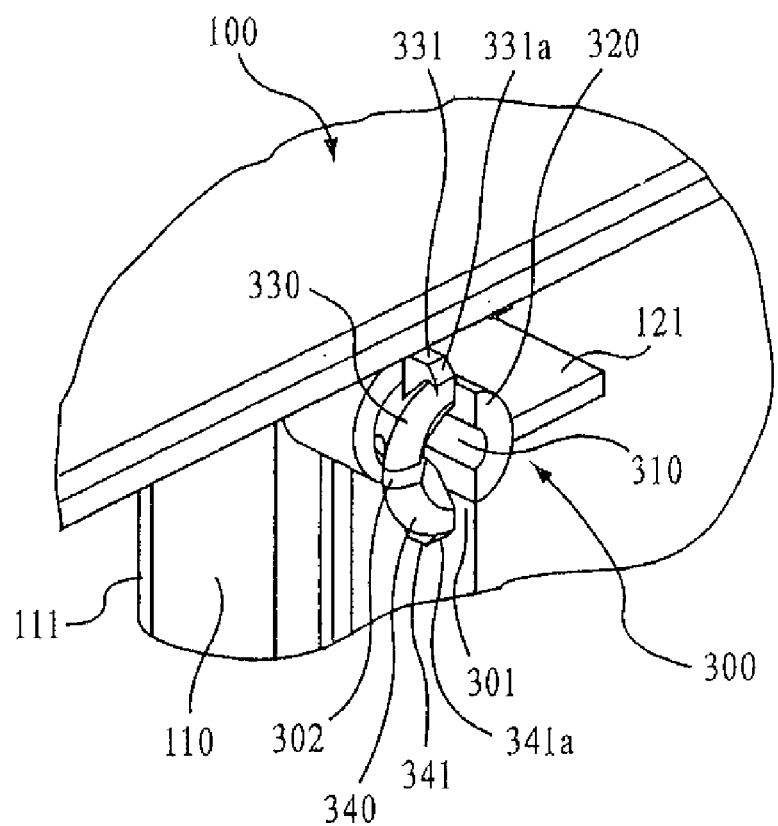
FIG. 2 is an enlarged perspective view illustrating a principal-portion of the front cover of FIG. 1.

A preferred embodiment of the present invention is specifically described below with reference to FIGS. 1-7.

A mounting structure of display panel according to the present embodiment is for attaching a display panel such as a liquid crystal display panel to a front cover of a liquid crystal display. Specifically, a display panel 200 (see FIG. 4) is attached to the back side of a front cover 100 shown in FIG. 1, and then a back side cover (not shown) positioned at the back side of the display panel 200 is connected to the front cover 100 to cover the display panel 200 or a control board (not shown) for driving the display panel.

The front cover 100 made of a resin includes a rectangular front frame 110 formed with an opening as a display window 111, and also includes a skirt wall 120 extending from four sides of the front frame 110 toward the back side by a constant width and being integrated with the front frame 110. The back side of the front frame 110 is provided with four bosses 300, one each at upper and lower portions of its sides. Each of the bosses extends thicknesswise of the front panel 110 or the display panel 200, adjacent to respective one of ribs 121 formed at the left or right inner surfaces of the skirt wall 120. The boss 300 is, as described below, structured for reliable positioning and attachment of the display panel 200. The inner surface of the front cover 100 is optionally formed with reinforcing ribs 122, or with bosses 123 for supporting the control board.

The above-described bosses 300 for attaching the display panel 200 are specifically illustrated in FIGS. 2, 5, 6 and 7. Each of the bosses 300 includes a screw hole 310 in which a tapping screw 350 is inserted, and its tip end portion is divided into a substantially semi-cylindrical portion 320 connected to the rib 121 and into two elastically-deformable guide members 330, 340 positioned opposite to the semi-cylindrical portion 320 across a vertical slit 301 or the screw hole 310. The guide members 330, 340 are substantially quartered cylinders positioned opposite to each other across a lateral slit 302, each including an end surface at a same position as an end surface of the semi-cylindrical portion 320. With such an arrangement, the guide members 330, 340 and the semi-cylindrical portion 320 cooperate to form a cylindrical unit surrounding the screw hole 310. The guide members 330, 340 also include thin-walled bases (see FIGS. 6 and 7), and thus are elastically deformable across the axis of the boss 300.

The tip ends of the guide members 330, 340 are outwardly formed with flanges, whose periphery is outwardly protruding beyond the outer circumference of the base of the boss 300. The tip ends of the guide members 330, 340 are also flared to guide the tapping screw 350 into the screw hole 310. Further, the tip ends of the guide members 330, 340 are respectively formed with guide projections 331, 341 at the vertically outward ends. The guide projections 331, 341 include ends formed with chamfered tapered portion 331a, 341a, respectively.

The above-described bosses 300, especially their guide members 330, 340, play an important role in positioning of the display panel 200, as described below.

The display panel 200 is a member such as a liquid crystal display panel that is rectangular in front view and has a predetermined thickness, and attached to the back side of the front cover 100 so that its display portion is exposed at the display window 111 of the front cover 100. The display panel 200 has an outer dimension small enough to be fitted within the skirt wall 120 of the front cover 100, and includes a circumference formed with four attaching portions 210, two each at the side ends, corresponding to the four bosses 300 formed at the front cover 100.

Figure 3A:
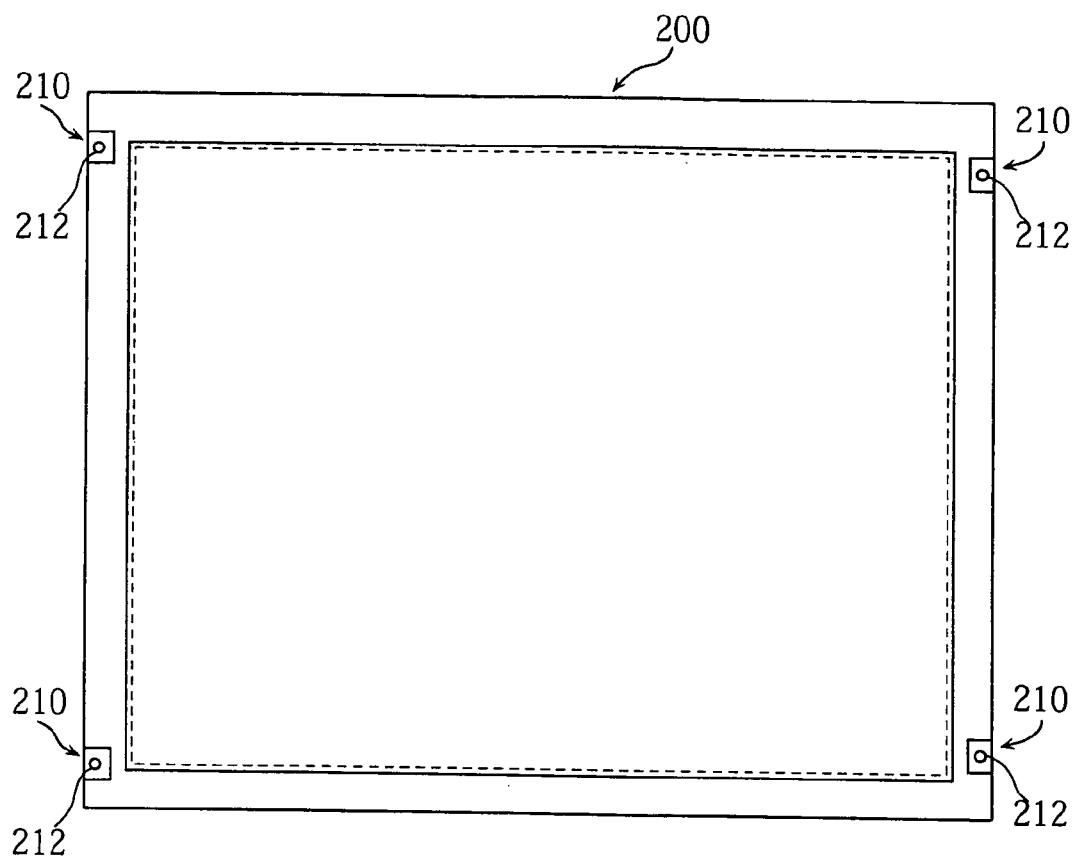
FIG. 3A is a schematic front view illustrating a display panel according to the embodiment of the present invention.
Figure 3B:
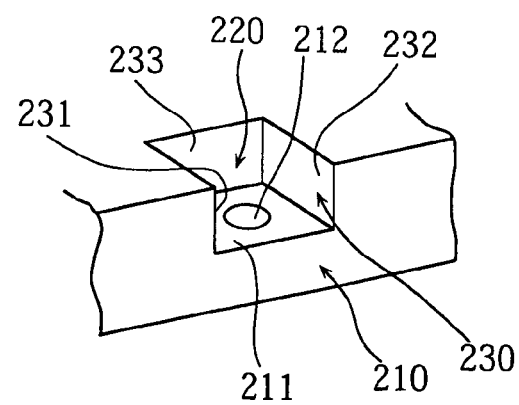
FIG. 3B is an enlarged perspective view illustrating a principal portion of the display panel.
Figure 4:
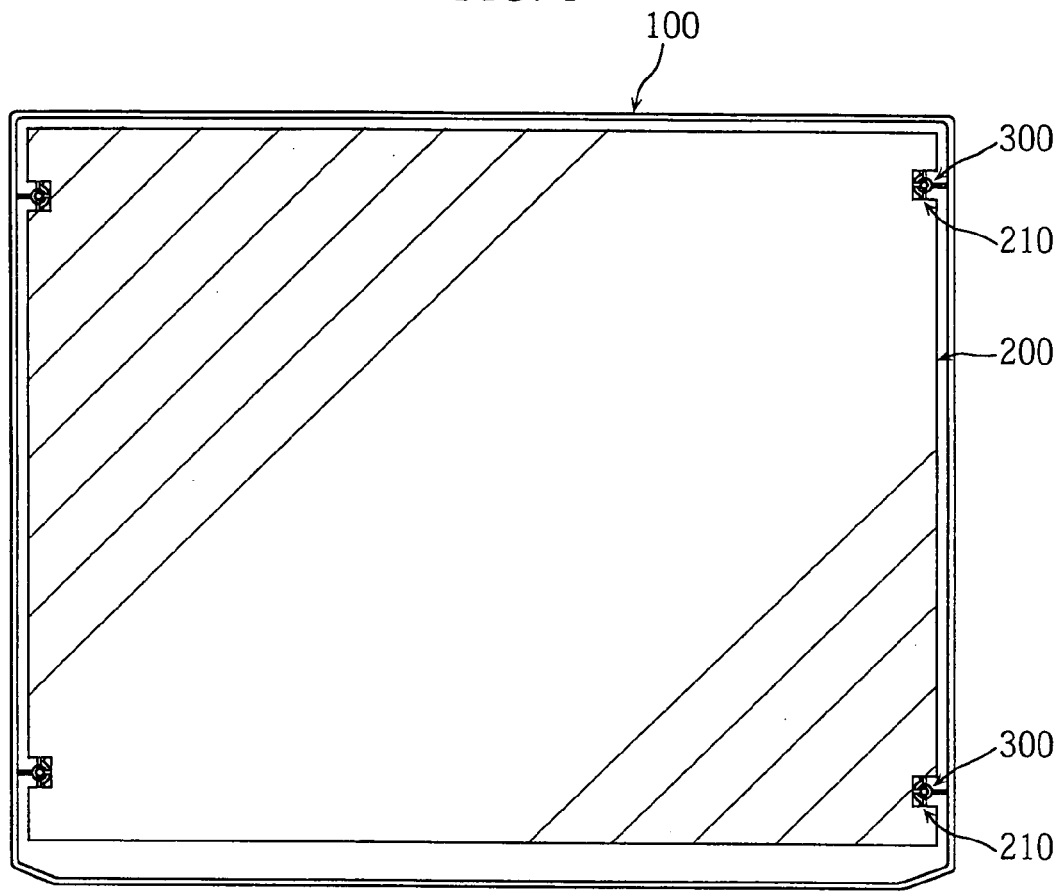
FIG. 4 is a back side view illustrating attachment of the display panel to the front cover according to the embodiment of the present invention.

As shown in FIGS. 3A and 3B, each of the attaching portions 210 includes a recess 220 that is formed at the circumference of the display panel 200, on the surface facing the back side of the front cover 100. The recess is open at the side end of the display panel 200, and thus a thin-walled portion 211 is provided. The thin-walled portion 211 is formed with a screw hole 212 penetrating thereof. The screw hole 212 has an inner diameter larger than an outer dimension of the tapping screw 350.

According to the illustrated embodiment, the recess 220 is substantially rectangular, and thus forms a guide wall 230 that includes a first wall 231 and a second wall 232 inwardly extending from the side end of the display panel 200 and facing to each other, and also includes a third wall 233 extending substantially parallel to the side end of the display panel 200 to connect the inner ends of the first and second walls. The depth of the recess 220 in thickness of the display 200, or the dimension of the guide wall 230 in thickness of the display 200, substantially corresponds to the height of each of the bosses 300 of the front cover 100.

The relationship between the dimensions of the guide wall 230 of the attaching portion 210 and the corresponding boss 300 is defined as described below.

The distance between the first wall 231 and the second wall 232 of the guide wall 230 is smaller than the distance between the outer surfaces of the guide projections 331, 341 of the guide members 330, 340 of the corresponding boss 300 in normal condition. The distance between the third walls 233 of the two attaching portions 210 which are formed opposite to each other in the lateral direction of the display panel 200 is larger than the distance between the inner ends of the guide members 330, 340 of the corresponding two bosses 300 in normal condition which are facing to each other in the lateral direction.

When attached to the front cover 100 which is favorably supported horizontally, the display panel 200 is positioned so that each recess 220 of the attaching portions 210 is fitted to respective one of the bosses 300, and then the tapping screws 350 are inserted through the screw holes 212 and screwed into the holes 310 of the bosses 300. The positioning of the display panel 200 relative to the front cover 100 is performed as described below.

Figure 5:
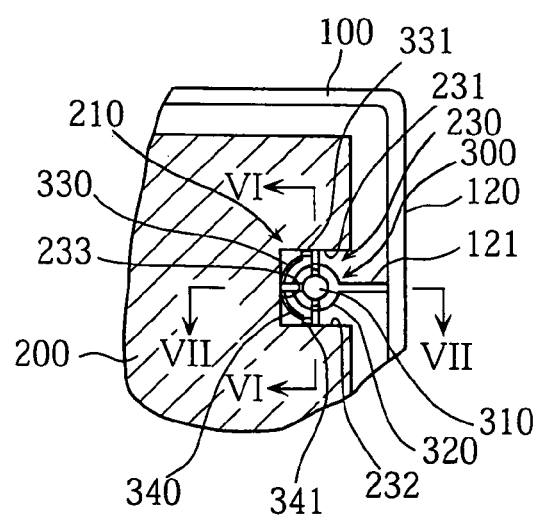
FIG. 5 is an enlarged view illustrating a principal portion of FIG. 4.
Figure 6:
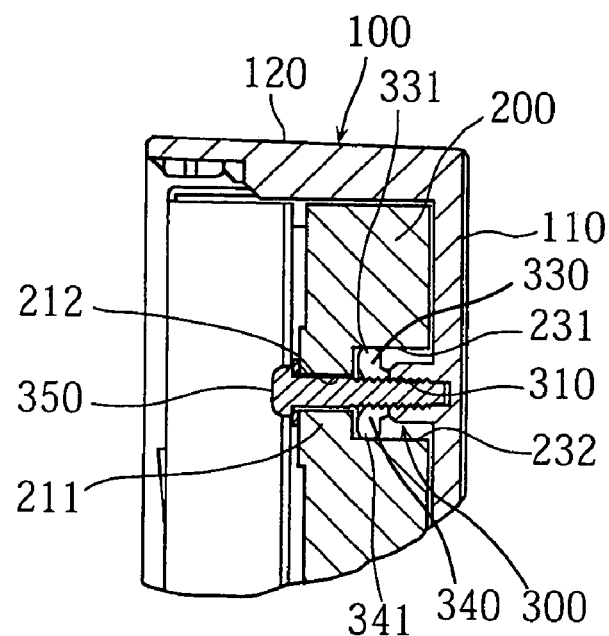
FIG. 6 is an enlarged sectional view taken along lines VI-VI of FIG. 5.

As described above, with respect to each of the bosses 300, the distance between the outer surfaces of the guide projections 331, 341 of the guide members 330, 340 in normal condition is larger than the distance between the first wall 231 and the second wall 232 of the corresponding one of the attaching portions 210. Thus, when the boss 300 is fitted in the recess 220 of the attaching portion 210, the guide members 330, 340 are forced to be elastically deformed and come closer to each other. Accordingly, as shown in FIGS. 5 and 6, the guide projections 331, 341 elastically contact the first wall 231 and the second wall 232. In this state, the elastic force of the guide projections 331, 341 against the first wall 231 and the second wall 232 is balanced, so that the position of the attaching portion 210 relative to the boss 300 is defined properly and automatically in the longitudinal direction (the extending direction of the side ends of the display panel 200). In this way, the position of the display panel 200 relative to the front cover 100 is adjusted properly and automatically in the longitudinal direction. Further, as described above, the guide projections 331, 341 of the guide members 330, 340 are formed with the tapered portions 331a, 341a, so that the boss 300 can be smoothly fitted into the recess 220 of the attaching portion 210.

Figure 7:
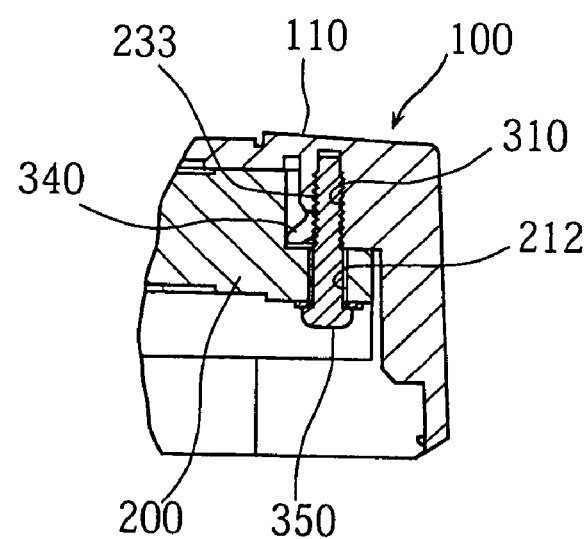
FIG. 7 is an enlarged sectional view taken along lines VII-VII of FIG. 5.

As described above, the distance between the third walls 233 of the two attaching portions 210 which are formed oppositely to each other in the lateral direction of the display panel 200 is larger than the distance between the inner ends of the guide members 330, 340 of the two bosses 300 corresponding to said two attaching portions 210. Thus, when the bosses 300 are fitted in the corresponding recesses 220 of the attaching portions 210, the guide members 330, 340 are forced to be elastically deformed and the distance between the inner ends of the guide members is enlarged. Accordingly, as shown in FIG. 7, the guide members 330, 340 elastically contact the third wall 233. In this state, each of the two bosses 300, which are positioned oppositely to each other in the lateral direction of the display panel, has the guide members 330, 340 applying an elastic force against the third wall 233, where the two elastic forces are balanced so that the positions of the attaching portions 210 relative to the two bosses 300 are defined properly and automatically in the lateral direction. In this way, the position of the display panel 200 relative to the front cover 100 is adjusted properly and automatically in the lateral direction.

Thereafter, the tapping screw 350 is screwed into the hole 310 of each of the bosses 300 to fix the adjusted position.

The present invention is not limited to the above-described embodiment, but may be modified in various ways, and all such modifications are intended to be included in the scope of the appended claims.

The display panel may be applied not only to the liquid crystal display panel, but may be applied to other display panels such as a plasma display panel.

In the present embodiment, the display panel is attached to the front cover, however, the display panel may be attached to a back side cover.

Further, in the present embodiment, the guide wall elastically contacted by the guide members of each of the bosses is provided by forming the recess open at the circumference of the display panel, however, the guide wall may be provided by vertically forming a projection with a guide wall on the surface of the display panel facing the cover.

The invention claimed is:

1. A mounting structure for attaching a display panel to a cover of a display, comprising:

a plurality of attaching portions provided at a circumference of the display panel, each of the attaching portions including a screw hole penetrating thicknesswise of the display panel and also including a guide wall formed on the surface of the display panel facing the cover, the guide wall surrounding the screw hole and extending thicknesswise of the display panel; and a plurality of bosses vertically formed at the cover and extending thicknesswise of the display panel, corresponding to a respective one of the attaching portions for receiving screws, each of the bosses integrally formed with at least two guide members that elastically contact the guide wall and elastically deformed in a direction across an axis of the boss;

wherein when the guide members of each of the bosses come into elastic contact with the guide wall of each of the attaching portions, a screw inserted through the screw hole of the attaching portion is inserted into the respective boss.

2. The mounting structure of display panel according to claim 1, wherein the display panel is rectangular in front view, and the attaching portions are formed at a plurality of portions along side ends of the display panel, wherein the guide wall of each of the attaching portions includes a first wall and a second wall inwardly extending from the side end of the display panel and facing to each other, and also includes a third wall extending in parallel to the side ends of the display panel.

3. The mounting structure of display panel according to claim 2, wherein one of the two guide members elastically contacts the first wall of the guide wall, while other one of the guide members elastically contacts the second wall of the guide wall, and at least one of the guide members also elastically contacts the third wall of the guide wall.

4. The mounting structure of display panel according to claim 2, wherein the guide wall is provided by forming a recess, on the surface of the display panel facing the cover, open at the side end of the display panel.

5. The mounting structure of display panel according to claim 1, wherein a tip end of each of the guide members is formed with a tapered portion.

6. The mounting structure of display panel according to claim 1, wherein the cover is a front cover having an opening serving as a display window.

* * * * *